(12) United States Patent
Trischler

(10) Patent No.: US 11,408,076 B2
(45) Date of Patent: Aug. 9, 2022

(54) METHOD AND APPARATUS FOR PERFORMING IMMERSION TIN PROCESS OR COPPER PLATING PROCESS IN THE PRODUCTION OF A COMPONENT CARRIER

(71) Applicant: AT&S Austria Technologie & Systemtechnik Aktiengesellschaft, Leoben (AT)

(72) Inventor: Heinrich Trischler, Eggersdorf bei Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/948,969

(22) Filed: Oct. 8, 2020

(65) Prior Publication Data
US 2021/0108315 A1 Apr. 15, 2021

(30) Foreign Application Priority Data
Oct. 10, 2019 (EP) .................................... 19202577

(51) Int. Cl.
*C23C 18/16* (2006.01)
*C23C 18/31* (2006.01)
(Continued)

(52) U.S. Cl.
CPC ...... *C23C 18/1682* (2013.01); *C23C 18/1628* (2013.01); *C23C 18/1653* (2013.01);
(Continued)

(58) Field of Classification Search
None
See application file for complete search history.

(56) References Cited

U.S. PATENT DOCUMENTS

| | | | |
|---|---|---|---|
| 3,658,664 | A | 4/1972 | Swalheim |
| 5,883,762 | A | 3/1999 | Calhoun et al. |

(Continued)

FOREIGN PATENT DOCUMENTS

| | | |
|---|---|---|
| CN | 201924065 U | 8/2011 |
| CN | 106686895 A | 5/2017 |

(Continued)

OTHER PUBLICATIONS

Suárez, R.C.; Extended European Search Report in Application 19202577.3; dated Jul. 28, 2020; pp. 1-13; European Patent Office, 80298, Munich, Germany.

(Continued)

*Primary Examiner* — Wojciech Haske
(74) *Attorney, Agent, or Firm* — Robert A. Blaha; Smith Tempel Blaha LLC

(57) ABSTRACT

A method of performing an immersion tin process in the production of a component carrier is provided which includes immersing at least a part of a copper surface of the component carrier in a composition containing Sn(II) in an immersion tin unit, while passing a non-oxidizing gas through the immersion tin unit, wherein at least part of the non-oxidizing gas is recycled. In addition, an apparatus for performing an immersion tin process in the production of a component carrier, a method of performing a copper plating process in the production of a component carrier and an apparatus for performing a copper plating process in the production of a component carrier are provided.

9 Claims, 2 Drawing Sheets

(51) Int. Cl.
  *C25D 3/38* (2006.01)
  *H05K 3/22* (2006.01)
(52) U.S. Cl.
  CPC ............... *C23C 18/31* (2013.01); *C25D 3/38* (2013.01); *H05K 3/22* (2013.01); *H05K 2203/072* (2013.01)

(56) References Cited

U.S. PATENT DOCUMENTS

| | | | |
|---|---|---|---|
| 2004/0000486 A1* | 1/2004 | Preusse | C25D 5/003 |
| | | | 205/88 |
| 2012/0148733 A1 | 6/2012 | Arnd et al. | |
| 2012/0175263 A1 | 7/2012 | Ganesan et al. | |
| 2012/0298515 A1 | 11/2012 | Skupin et al. | |
| 2016/0097141 A1 | 4/2016 | Yasuda et al. | |
| 2018/0347038 A1 | 12/2018 | Santos et al. | |

FOREIGN PATENT DOCUMENTS

| | | |
|---|---|---|
| JP | H0860376 A | 3/1996 |
| WO | 2004003663 A2 | 1/2004 |

OTHER PUBLICATIONS

Suárez, R.C.; Partial European Search Report in Application 19202577.3; dated May 6, 2020; pp. 1-11; European Patent Office, 80298, Munich, Germany.

* cited by examiner

METHOD AND APPARATUS FOR PERFORMING IMMERSION TIN PROCESS OR COPPER PLATING PROCESS IN THE PRODUCTION OF A COMPONENT CARRIER

TECHNICAL FIELD

The invention relates to a a method and an apparatus for performing an immersion tin process in the production of a component carrier and a method and an apparatus for performing a copper plating process in the production of a component carrier.

TECHNOLOGICAL BACKGROUND

In the manufacture of a component carrier, such as a printed circuit board (PCB) or a substrate, the provision of metal surfaces is a common task.

For example, tin surfaces may be provided as a final finish serving as a solderable or bondable surface for subsequent assembly steps. Tin is often deposited onto copper portions of a component carrier denoted as contact pads. The method of choice for tin application is deposition of tin by electroless plating procedures with immersion tin plating as the most commonly applied method. In particular, for an immersion tin surface finish in PCB production the immersion tin process may be applied. The formation of thin tin layers (down to 1 µm) on copper PCB pads is typically performed by an immersion reaction in an acidic Sn(II) thiourea solution. The copper of the PCB pads is oxidized and replaced by tin metal, which is deposited from the acidic thiourea Sn(II) solution, in accordance with the following reaction equation: $2\ Cu+Sn^{2+} \rightarrow 2\ Cu^{+}+Sn$.

Moreover, copper surfaces may be provided serving for instance as conductive traces. To this end, copper is generally deposited by a copper plating process which may involve both electrolytic and electroless plating techniques.

Usually, the immersion tin process is performed in an air atmosphere. However, when performing the immersion tin process in an oxygen containing air atmosphere, an undesired oxidation reaction of Sn(II) with oxygen from the air to tin dioxide ($SnO_2$) may occur in the process modules. The undesired formation of $SnO_2$ solids may cause blocking of the driving gears for the rollers in the modules and of the filter units and may lead to a disturbed final surface appearance. Because of the undesired tin dioxide formation with oxygen from the air, a large effort of maintenance including exchanging of blocked filters has to be done within few days. Also, the copper plating process may tend to undesired oxidation side products (for instance of organic compounds in the copper plating composition) in the presence of an oxygen containing air atmosphere.

When replacing the air atmosphere by a non-oxidizing atmosphere, such as a nitrogen atmosphere, a continuous and expensive supply of large volumes of for instance nitrogen gas (such as more than 200 $m^3$ per hour for a typical immersion tin or copper plating unit) from a nitrogen generator or from nitrogen gas bottles would be required. However, the costs for providing such large volumes of nitrogen gas would exceed the costs of maintenance and downtime so that this approach does not represent an economic solution to the above-described problems in commercial immersion tin or copper plating processes.

In addition, as mentioned above, an acidic Sn(II) thiourea solution is typically used in an immersion tin process. The thiourea serves for complexing of copper ions which renders the oxidation of the more noble copper by less noble Sn(II) possible in the first place. However, at typical immersion tin temperatures of for instance 70° C., thiourea may decompose to a certain degree into hydrogen sulphide ($H_2S$), which in turn may react with copper ions (in particular $Cu^{2+}$) to undesired black CuS.

SUMMARY

There may be a need for methods and apparatuses, which allow for performing an immersion tin process or a copper plating process in the production of a component carrier in a stable and cost-efficient manner with significantly reduced maintenance efforts and downtimes.

According to an exemplary embodiment of the invention, a method of performing an immersion tin process in the production of a component carrier (such as a printed circuit board or a substrate) is provided which comprises immersing at least a part of a copper surface (in particular a copper pad) of the component carrier in a composition (in particular a solution) containing Sn(II) in an immersion tin unit, while passing (circulating, streaming, flowing) a non-oxidizing (inert) gas (atmosphere) through the immersion tin unit (in particular such that the immersion tin unit is substantially filled with the non-oxidizing gas), wherein at least part of the non-oxidizing gas is recycled (in particular circulated).

According to another exemplary embodiment of the invention, an apparatus (such as an arrangement) for performing an immersion tin process in the production of a component carrier (such as a printed circuit board or a substrate) is provided which comprises at least one non-oxidizing (inert) gas (in particular nitrogen) generation unit, at least one immersion tin unit, at least one fluid driving unit, at least one gas-gas (in particular nitrogen-nitrogen) heat exchanger, at least one gas-water (in particular nitrogen-water) heat exchanger, at least one water removing unit upstream and/or downstream of the gas-water heat exchanger, and at least one $H_2S$ removing unit. The apparatus is in particular configured for circulating non-oxidizing gas and may therefore comprise respective conduits, in particular conduits providing a fluidic connection between the individual units or entities of the arrangement.

According to still another exemplary embodiment of the invention, a method of performing a copper plating process in the production of a component carrier (such as a printed circuit board or a substrate) is provided which comprises plating at least a part of a surface of the component carrier with copper in a copper plating unit, while passing (circulating, streaming, flowing) a non-oxidizing (inert) gas (atmosphere) through the copper plating unit (in particular such that the copper plating unit is substantially filled with the non-oxidizing gas), wherein at least part of the non-oxidizing gas is recycled (in particular circulated).

According to yet another exemplary embodiment of the invention, an apparatus (such as an arrangement) for performing a copper plating process in the production of a component carrier (such as a printed circuit board or a substrate) is provided which comprises at least one non-oxidizing (inert) gas (nitrogen) generation unit, at least one copper plating unit, and at least one fluid driving unit. The apparatus is in particular configured for circulating non-oxidizing gas and may therefore comprise respective conduits, in particular conduits providing a fluidic connection between the individual units or entities of the arrangement.

OVERVIEW OF EMBODIMENTS

In the context of the present application, the term "immersion tin process" may particularly denote a process of electroless plating of tin (or tin alloys) as a surface finish (in particular of copper surfaces, such as copper pads) in the manufacturing of a component carrier. It may therefore also be referred to as an "immersion tin plating process" or "electroless tin plating process".

In the context of the present application, the term "copper plating process" may particularly denote a process of plating a layer of copper electrolytically (galvanically) or in an electroless (non-galvanic) manner on the surface of a part of a component carrier.

In the context of the present application, the term "non-oxidizing gas" may particularly denote a gas (or gas mixture or gas atmosphere) that does not have the ability to cause oxidation, in particular that does not have the ability to cause oxidation of Sn(II) to Sn(IV) and/or of organic compounds. A "non-oxidizing gas" may in particular contain substantially no oxygen, for instance less than 2 vol % of oxygen, preferably less than 1 vol % of oxygen, or similar oxidative gases, such as ozone or peroxides. Within the context of the present application, the term "non-oxidizing gas" may also be referred to as an "inert gas" or an "inert gas atmosphere".

According to an exemplary embodiment of the invention, a method and an apparatus for performing an immersion tin process and a method and an apparatus for performing a copper plating process are provided wherein a recycled non-oxidizing (i.e., inert) gas (atmosphere) is passed or circulated through an immersion tin unit and a copper plating unit, respectively, such that these units are substantially filled with the non-oxidizing gas, while the tin immersion and copper plating, respectively, are carried out. By using a recycled non-oxidizing gas atmosphere, i.e., by circulating of non-oxidizing gas, such as nitrogen, through different units or entities of an apparatus or arrangement, not only undesired oxidative side reactions may be suppressed or even avoided in a cost-efficient manner, but also by-products, such as hydrogen sulphide ($H_2S$) in case of immersion tin plating, may be efficiently removed. As a result, an immersion tin process as well as a copper plating process in the production of a component carrier may be carried out in a stable and cost-efficient manner with significantly reduced maintenance efforts and downtimes.

In the following, further exemplary embodiments of the method and the apparatus for performing an immersion tin process and the method and the apparatus for performing a copper plating process will be explained. However, the present invention is not limited to the following specific descriptions of exemplary embodiments, but they are rather for illustrative purposes only.

It should be noted that features described in connection with one exemplary embodiment or exemplary aspect may be combined with any other exemplary embodiment or exemplary aspect, in particular features described with any exemplary embodiment of a method of performing a process may be combined with any other exemplary embodiment of a method of performing a process and any exemplary embodiment of an apparatus for performing a process and vice versa, unless specifically stated otherwise.

Where an indefinite or definite article is used when referring to a singular term, such as "a", "an" or "the", a plural of that term is also included and vice versa, unless specifically stated otherwise, whereas the word "one" or the number "1", as used herein, typically means "just one" or "exactly one".

It should be noted that the term "comprising" does not exclude other elements or steps and, as used herein, includes not only the meaning of "comprising", "including" or "containing", but also encompasses "consisting essentially of" and "consisting of".

Unless specifically stated otherwise, the expressions "at least partially", "at least a partial" or "at least a part of", as used herein, may mean at least 5% thereof, in particular at least 10% thereof, in particular at least 15% thereof, in particular at least 20% thereof, in particular at least 25% thereof, in particular at least 30% thereof, in particular at least 35% thereof, in particular at least 40% thereof, in particular at least 45% thereof, in particular at least 50% thereof, in particular at least 55% thereof, in particular at least 60% thereof, in particular at least 65% thereof, in particular at least 70% thereof, in particular at least 75% thereof, in particular at least 80% thereof, in particular at least 85% thereof, in particular at least 90% thereof, in particular at least 95% thereof, in particular at least 98% thereof, and may also mean 100% thereof.

In an embodiment, the method of performing an immersion tin process in the production of a component carrier comprises:
immersing at least a part of a copper surface (in particular a copper pad) of the component carrier in a composition (in particular a solution) containing Sn(II) in an immersion tin unit,
while passing (circulating, streaming, flowing) a non-oxidizing (inert) gas (atmosphere) through the immersion tin unit (in particular such that the immersion tin unit is substantially filled with the non-oxidizing gas), wherein at least part of the non-oxidizing gas is recycled (in particular circulated).

In an embodiment, the step of immersing at least a part of a copper surface of the component carrier in a composition (in particular a solution) containing Sn(II) comprises a dipping of the at least a part of a copper surface of the component carrier in a bath containing a Sn(II)-containing solution. Additionally or alternatively, the composition containing Sn(II) may be sprayed or otherwise applied onto the at least a part of a copper surface of the component carrier.

In an embodiment, the composition containing Sn(II) further contains a complexing agent for copper (in particular for copper ions) and an acid. By taking this measure, the yield and/or the speed of the copper/tin redox reaction may be increased. The complexing agent for copper may in particular comprise thiourea and/or the acid may in particular comprise methanesulfonic acid, which have proven particularly suitable for an immersion tin process.

In an embodiment, the immersing step is carried out at a temperature of from 50 to 95° C., in particular 60 to 85° C., in particular 70 to 75° C., which have proven particularly suitable temperatures for carrying out an immersion tin process.

In an embodiment, the immersing step is carried out under an elevated gas pressure within the immersion tin unit, in particular 1.02 to 1.2 times (normal) atmospheric pressure, in particular 1.05 to 1.1 times atmospheric pressure. By taking this measure, it may be efficiently suppressed or even avoided that air (and thus oxygen) may enter the immersion tin unit where it may cause undesired side reactions, such as an oxidation of Sn(II) to Sn(IV), thereby forming undesired tin dioxide ($SnO_2$). In this regard, it should be noted that immersion tin units are generally not hermetically closed compartments, but may typically allow for a certain gas exchange, for instance may allow for a release of excessive non-oxidizing gas atmosphere to the surrounding environment in an embodiment of the present invention.

In an embodiment, the non-oxidizing gas (atmosphere) comprises at least 95 vol % of nitrogen, in particular at least 98 vol % of nitrogen, such as at least 99 vol % of nitrogen. In addition to the nitrogen, the non-oxidizing gas (atmosphere) may comprise further non-oxidizing (inert) gases, such as argon, carbon dioxide, neon, helium, etc., but may also comprise small amounts (for instance less than 2 vol. %, preferably less than 1 vol. %) of oxidizing gases, such as oxygen. Nitrogen is a relatively inexpensive non-oxidizing gas, which is contained in air in large amounts (typically about 78 vol %) so that it is advantageous for cost reasons that the non-oxidizing gas (atmosphere) mainly comprises nitrogen. As would be apparent to a person skilled in the art, the non-oxidizing gas (atmosphere) may also comprise larger amounts (such as more than 5 vol %) of other inert gases, such as noble gases, while not economically preferred. Moreover, small amounts of oxidizing gases, such as oxygen, may be tolerable, as long as they do not cause significant undesired oxidative side reactions, such as an oxidation reaction of Sn(II) to Sn(IV) to thereby yield tin dioxide ($SnO_2$).

In an embodiment, the non-oxidizing gas passes through the immersion tin unit containing a composition containing Sn(II). In particular, the non-oxidizing gas preferably streams or flows over (above) the composition containing Sn(II), rather than through the composition containing Sn(II). Thus, it is not required that the non-oxidizing gas is bubbled through the composition containing Sn(II), such as a bath containing a Sn(II) solution. Rather, it might be advantageous if (only) the head space of the immersion tin unit is substantially filled with the non-oxidizing gas. By taking this measure, it may be possible to perform the immersion tin process without interferences caused by gas bubbles at a copper surface to be plated with tin, which gas bubbles may impair material exchange between the copper surface and the tin solution.

In an embodiment, at least part of the non-oxidizing gas is recycled and re-used, in particular re-introduced into the immersion tin unit. In other words, at least part (such at least 80% or at least 90%) of the non-oxidizing gas passing through the immersion tin unit is circulated through other units or entities of an apparatus for performing an immersion tin process, wherein the non-oxidizing gas may be treated and in particular purified and eventually re-introduced into the immersion tin unit.

In an embodiment, the method may further comprise circulating at least part of the non-oxidizing gas (exiting the immersion tin unit) through at least one of the following other units or entities of an apparatus for performing an immersion tin process:
- a fluid driving unit (configured for driving the fluid containing the at least part of the non-oxidizing gas (which may also be referred to as "circulated stream of non-oxidizing gas" hereinafter), such as a blower, a fan, and/or a compressor),
- a gas-gas (in particular nitrogen-nitrogen) heat exchanger (configured for pre-cooling the at least part of the non-oxidizing gas exiting the immersion tin unit and being saturated with water and at the same time heating dry non-oxidizing gas after water removal),
- a gas-water (in particular nitrogen-water) heat exchanger (configured for further cooling the precooled circulated stream of non-oxidizing gas),
- a water removing unit (in particular a water condensing unit or water splitter, such as a cyclone) configured for removing water from the circulated stream of non-oxidizing gas and which may be arranged upstream and/or downstream of the gas-water heat exchanger, and/or
- a $H_2S$ removing unit (containing a solid or liquid $H_2S$ absorber, such as $Fe_2O_3$, and configured for eliminating $H_2S$ from the circulated stream of non-oxidizing gas).

In an embodiment, the method may further comprise supplying excessive or fresh non-oxidizing gas into the circulated stream of non-oxidizing gas, for instance by means of a non-oxidizing gas (in particular nitrogen) generator (or generation unit) configured for generating non-oxidizing gas from compressed air. By taking this measure, it may be efficiently suppressed or even avoided that air (and thus oxygen) may penetrate into the circulation of non-oxidizing gas and eventually enter the immersion tin unit where it may cause undesired side reactions, such as an oxidation of Sn(II) to Sn(IV), thereby forming undesired tin dioxide ($SnO_2$).

In an embodiment, the apparatus (such as an arrangement) for performing an immersion tin process in the production of a component carrier comprises at least the following units or entities:
- at least one non-oxidizing gas generation unit (configured for generating excess non-oxidizing gas (in particular nitrogen) from compressed air),
- at least one immersion tin unit (configured for performing immersion tin plating by immersing at least a part of a copper surface of the component carrier in a composition containing Sn(II), while passing a non-oxidizing gas through the immersion tin unit, in particular over (above) the composition containing Sn(II), rather than through the composition containing Sn(II)),
- at least one fluid driving unit (configured for driving the fluid containing the at least part of the non-oxidizing gas, such as a blower, a fan, and/or a compressor),
- at least one gas-gas (in particular nitrogen-nitrogen) heat exchanger (configured for pre-cooling the at least part of the non-oxidizing gas exiting the immersion tin unit and saturated with water and at the same time heating dry non-oxidizing gas after water removal),
- at least one gas-water (in particular nitrogen-water) heat exchanger (configured for further cooling the precooled circulated stream of non-oxidizing gas),
- at least one water removing unit (in particular a water condensing unit or water splitter, such as a cyclone) configured for removing water from the circulated stream of non-oxidizing gas and arranged upstream and/or downstream of the gas-water heat exchanger, and
- at least one $H_2S$ removing unit (containing a solid or liquid $H_2S$ absorber, such as $Fe_2O_3$, and configured for eliminating $H_2S$ from the circulated stream of non-oxidizing gas).

In an embodiment, the apparatus for performing an immersion tin process is in particular configured for circulating non-oxidizing gas and may therefore comprise respective conduits, in particular conduits providing a fluidic connection between the individual units or entities of the arrangement.

In an embodiment, the apparatus is configured for circulating more than 100 m³/h, in particular more than 200 m³/h, of non-oxidizing (inert) gas.

In an embodiment, the at least one non-oxidizing gas generation unit and the at least one immersion tin unit are located in the same compartment, such as in the same room of a building. By taking this measure, it may be ensured that the composition in the surrounding air atmosphere is substantially maintained or unchanged because the amount of non-oxidizing gas (such as nitrogen) removed from the surrounding air atmosphere by the non-oxidizing gas generation unit corresponds to the amount of excessive non-oxidizing gas (such as nitrogen) released from the immersion tin unit to the surrounding air atmosphere.

In an embodiment, the method of performing a copper plating process in the production of a component carrier comprises:
  plating at least a part of a surface of the component carrier with copper in a copper plating unit,
  while passing (circulating, streaming, flowing) a non-oxidizing (inert) gas (atmosphere) through the copper plating unit (in particular such that the copper plating unit is substantially filled with the non-oxidizing gas), wherein at least part of the non-oxidizing gas is recycled (in particular circulated).

In an embodiment, the step of plating at least a part of a surface of the component carrier with copper comprises an electrolytic (galvanic) plating or an electroless (non-galvanic) plating.

In an embodiment, the plating step is carried out under an elevated gas pressure within the copper plating unit, in particular 1.02 to 1.2 times (normal) atmospheric pressure, in particular 1.05 to 1.1 times atmospheric pressure. By taking this measure, it may be efficiently suppressed or even avoided that air (and thus oxygen) may enter the copper plating unit where it may cause undesired side reactions, such as an oxidation of organic compounds in the copper plating composition. In this regard, it should be noted that copper plating units are generally not hermetically closed compartments, but may typically allow for a certain gas exchange, for instance may allow for a release of excessive non-oxidizing gas atmosphere to the surrounding environment in an embodiment of the present invention.

In an embodiment, the non-oxidizing gas (atmosphere) comprises at least 95 vol % of nitrogen, in particular at least 98 vol % of nitrogen, such as at least 99 vol % of nitrogen. In addition to the nitrogen, the non-oxidizing gas (atmosphere) may comprise further non-oxidizing (inert) gases, such as argon, carbon dioxide, neon, helium, etc., but may also comprise small amounts (for instance less than 2 vol. %, preferably less than 1 vol. %) of oxidizing gases, such as oxygen. Nitrogen is a relatively inexpensive non-oxidizing gas, which is contained in air in large amounts (typically about 78 vol %) so that it is advantageous for cost reasons that the non-oxidizing gas (atmosphere) mainly comprises nitrogen. As would be apparent to a person skilled in the art, the non-oxidizing gas (atmosphere) may also comprise larger amounts (such as more than 5 vol %) of other inert gases, such as noble gases, while not economically preferred. Moreover, small amounts of oxidizing gases, such as oxygen, may be tolerable, as long as they do not cause significant undesired oxidative side reactions, such as an oxidation of organic compounds in the copper plating composition.

In an embodiment, at least part of the non-oxidizing gas is recycled and re-used, in particular re-introduced into the copper plating unit. In other words, at least part (such at least 80% or at least 90%) of the non-oxidizing gas passing through the copper plating unit is circulated through other units or entities of an apparatus for performing a copper plating process, wherein the non-oxidizing gas may be treated and in particular purified and eventually re-introduced into the copper plating unit.

In an embodiment, the method may further comprise circulating at least part of the non-oxidizing gas (exiting the copper plating unit) through at least one of the following other units or entities of an apparatus for performing an copper plating process:
  a fluid driving unit (configured for driving the fluid containing the at least part of the non-oxidizing gas (which may also be referred to as "circulated stream of non-oxidizing gas" hereinafter), such as a blower, a fan, and/or a compressor),
  a gas-water (in particular nitrogen-water) heat exchanger (configured for cooling the circulated stream of non-oxidizing gas exiting the copper plating unit and being saturated with water),
  a water removing unit (in particular a water condensing unit or water splitter, such as a cyclone) configured for removing water from the circulated stream of non-oxidizing gas and which may be arranged downstream of the gas-water heat exchanger,
  a gas filter unit (configured for purifying the circulated stream of non-oxidizing gas, such as be means of active carbon or zeolite); and
  a cooling water supply unit (configured for supplying the gas-water heat exchanger with cool water).

In an embodiment, the method may further comprise supplying excessive or fresh non-oxidizing gas into the circulated stream of non-oxidizing gas, for instance by means of a non-oxidizing gas (in particular nitrogen) generator (or generation unit) configured for generating non-oxidizing gas from compressed air. By taking this measure, it may be efficiently suppressed or even avoided that air (and thus oxygen) may penetrate into the circulation of non-oxidizing gas and eventually enter the copper plating unit where it may cause undesired side reactions, such as an oxidation of organic compounds in the copper plating composition.

In an embodiment, the apparatus (such as an arrangement) for performing a copper plating process in the production of a component carrier comprises at least the following units or entities:
  at least one non-oxidizing (inert) gas generation unit (configured for generating non-oxidizing gas (in particular nitrogen) from compressed air),
  at least one copper plating unit (configured for performing copper plating by plating at least a part of a surface of the component carrier with copper, while passing a non-oxidizing gas through the copper plating unit, in particular such that the copper plating unit is substantially filled with the non-oxidizing gas), and
  at least one fluid driving unit (configured for driving the fluid containing the at least part of the non-oxidizing gas, such as a blower, a fan, and/or a compressor).

In an embodiment, the apparatus for performing a copper plating process is in particular configured for circulating non-oxidizing gas and may therefore comprise respective conduits, in particular conduits providing a fluidic connection between the individual units or entities of the arrangement.

In an embodiment, the apparatus is configured for circulating more than 100 m$^3$/h, in particular more than 200 m$^3$/h, of non-oxidizing (inert) gas.

In an embodiment, the apparatus for performing a copper plating process further comprises at least one of the following units or entities:
  at least one gas-water (in particular nitrogen-water) heat exchanger (configured for cooling the circulated stream of non-oxidizing gas exiting the copper plating unit and being saturated with water), at least one water removing unit (in particular a water condensing unit or water splitter, such as a cyclone) configured for removing water from the circulated stream of non-oxidizing gas and which may be arranged downstream of the gas-water heat exchanger, at least one gas filter unit (configured for purifying the circulated stream of non-oxidizing gas, such as be means of active carbon or zeolite); and/or at least one cooling water supply unit (configured for supplying the gas-water heat exchanger with cool water).

In an embodiment, the at least one non-oxidizing gas generation unit and the at least one copper plating unit are located in the same compartment, such as in the same room of a building. By taking this measure, it may be ensured that the composition in the surrounding air atmosphere is substantially maintained or unchanged because the amount of non-oxidizing gas (such as nitrogen) removed from the surrounding air atmosphere by the non-oxidizing gas generation unit corresponds to the amount of excessive non-oxidizing gas (such as nitrogen) released from the copper plating unit to the surrounding air atmosphere.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene)(Teflon®), a ceramic, and a metal oxide. Teflon is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are OSP (Organic Solderability Preservative), Electroless Nickel Immersion Gold (ENIG), gold (in particular Hard Gold), chemical tin, nickel-gold, nickel-palladium, etc.

The aspects defined above and further aspects of the invention are apparent from the exemplary embodiments to be described hereinafter and are explained with reference to these exemplary embodiments.

DETAILED DESCRIPTION OF THE ILLUSTRATED EMBODIMENTS

Figure 1:
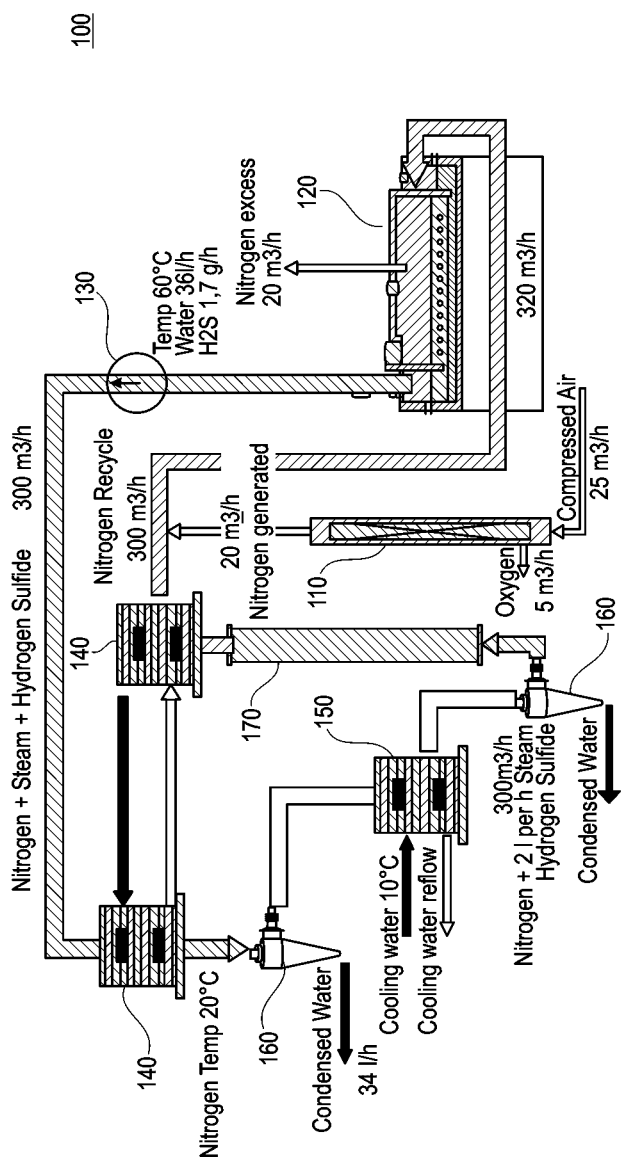
FIG. 1 illustrates an apparatus for performing an immersion tin process according to an exemplary embodiment of the invention.

The illustrations in the drawings are schematically presented. In different drawings, similar or identical elements are provided with the same reference signs.

FIG. 1 illustrates an apparatus 100 for performing an immersion tin process according to an exemplary embodiment of the invention. The apparatus 100 comprises an immersion tin unit 120 where the actual immersion tin plating is performed by immersing at least a part of a copper surface of a component carrier (not shown) in a composition containing Sn(II), while passing a non-oxidizing gas through the immersion tin unit 120. In the embodiment shown in FIG. 1 a stream of 320 m$^3$/h of non-oxidizing gas (basically comprising nitrogen) enters into the immersion tin unit 120. Hereof, 20 m$^3$/h of excessive nitrogen gas is exhausted into the surrounding environment, whereas the majority of the gas stream (more specifically 300 m$^3$/h) having a temperature of 60° C. and significant water and H$_2$S contents is circulated (recycled). To this end, a fluid driving unit 130 drives the circulating stream of the non-oxidizing gas. In FIG. 1, the fluid driving unit 130 is depicted directly downwards of the immersion tin unit 120. As will be appreciated by a person skilled in the art, the fluid driving unit 130 may also be arranged at other positions of the circulating system and it may also be possible to arrange two or more fluid driving units 130 at different positions of the circulating system. The still warm circulating stream of non-oxidizing gas containing water (steam) and $H_2S$ is then passed through a gas-gas heat exchanger 140, where the warm and water-saturated circulating stream of non-oxidizing gas is pre-cooled, while at the same time dry non-oxidizing gas stream after water removal is heated. Due to the pre-cooling, water may be condensed and removed from the circulating stream of non-oxidizing gas in a water removing unit 160, such as a cyclone. Subsequently, the partially dried circulating stream of non-oxidizing gas may be further fed to a gas-water heat exchanger 150 where the circulated stream of non-oxidizing gas is further cooled, so as to cause a further condensation and removal of water in a further water removing unit 160, such as an additional cyclone, downstream of the gas-water heat exchanger 150. The thus dried stream of non-oxidizing gas is then fed into a $H_2S$ removing unit 170 where $H_2S$ is absorbed by for instance iron oxide ($Fe_2O_3$) and thus eliminated from the circulated stream of non-oxidizing gas. The dry non-oxidizing gas stream freed from $H_2S$ may then be warmed in the same gas-gas heat exchanger 140 discussed above and returned to the immersion tin unit 120. Excess nitrogen gas (in the depicted embodiment, 20 m³/h) supplied by a nitrogen generation unit 110 may be fed to the non-oxidizing gas stream prior to entering into the immersion tin unit 120 so as to provide for an elevated gas pressure within the immersion tin unit 120 thereby avoiding the penetration of air (and thus oxygen) into the immersion tin unit 120. As a result, an immersion tin process with a circulating non-oxidizing gas atmosphere may be carried out in a stable and cost-efficient manner with significantly reduced maintenance efforts and downtimes.

Figure 2:
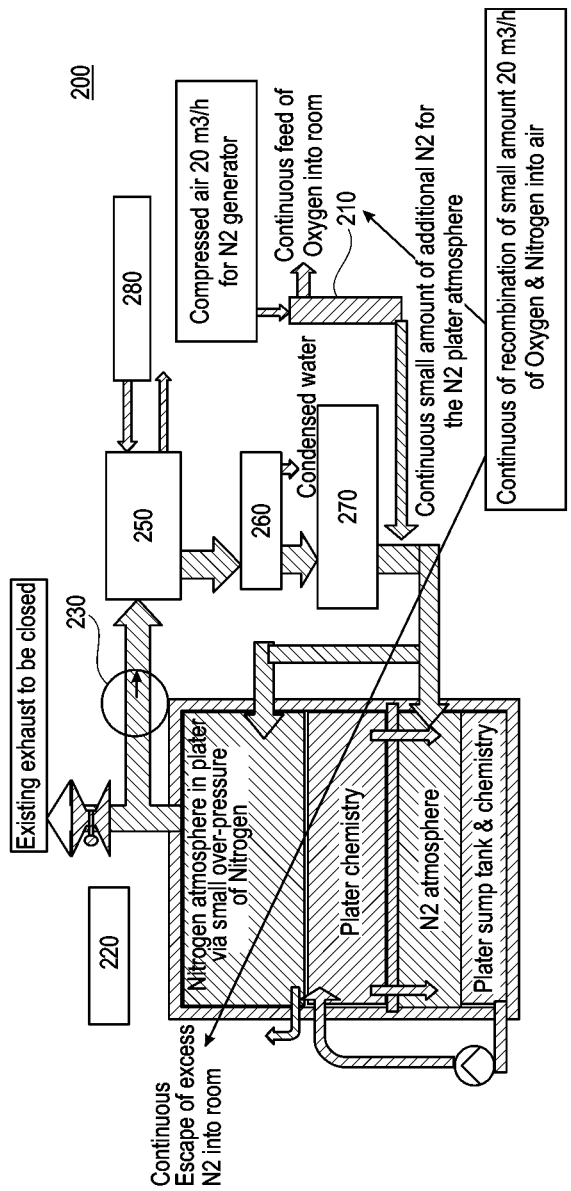
FIG. 2 illustrates an apparatus for performing a copper plating process according to an exemplary embodiment of the invention.

FIG. 2 illustrates an apparatus 200 for performing a copper plating process according to an exemplary embodiment of the invention. The apparatus 200 comprises a copper plating unit 220 where the actual copper plating is performed involving plater chemistry, while passing a non-oxidizing gas through the copper plating unit 220. More specifically, a stream of non-oxidizing gas (basically comprising nitrogen) enters into the copper plating unit 220. Hereof, a small part of for instance 10 to 20 m³/h of excessive nitrogen gas is exhausted into the surrounding environment, whereas the majority of the gas stream having a significant water content is circulated (recycled). To this end, a fluid driving unit 230 drives the circulating stream of the non-oxidizing gas. In FIG. 2, the fluid driving unit 230 is depicted (directly) downwards of the copper plating unit 220. As will be appreciated by a person skilled in the art, the fluid driving unit 230 may also be arranged at other positions of the circulating system and it may also be possible to arrange two or more fluid driving units 230 at different positions of the circulating system. The circulating stream of non-oxidizing gas containing water (steam) is then passed through a gas-water heat exchanger 250 where the circulated stream of non-oxidizing gas is cooled, so as to cause condensation and removal of water in a water removing unit 260, such as a water splitter, downstream of the gas-water heat exchanger 250. Cool water may be supplied to gas-water heat exchanger 250 by means of a cooling water supply unit 280. The thus dried stream of non-oxidizing gas is then passed through a gas filter unit 270 containing for instance active carbon or zeolite and returned to the copper plating unit 220. Excess nitrogen gas (in the depicted embodiment, about 10 to 20 m³/h) supplied by a nitrogen generation unit 210 may be fed to the non-oxidizing gas stream prior to entering into the copper plating unit 220 so as to provide for an elevated gas pressure within the copper plating unit 220 thereby avoiding the penetration of air (and thus oxygen) into the copper plating unit 220. As a result, a copper plating process with a circulating non-oxidizing gas atmosphere may be carried out in a stable and cost-efficient manner with significantly reduced maintenance efforts and downtimes.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of performing an immersion tin process in the production of a component carrier, the method comprising:
   immersing at least a part of a copper surface of the component carrier in a composition containing Sn(II) in an immersion tin unit, while passing a non-oxidizing gas through the immersion tin unit, wherein at least part of the non-oxidizing gas is recycled,
   the method further comprising circulating at least part of the non-oxidizing gas through a $H_2S$ removing unit.

2. The method of performing an immersion tin process in the production of a component carrier according to claim 1, wherein the composition containing Sn(II) further contains a complexing agent for copper and an acid.

3. The method of performing an immersion tin process in the production of a component carrier according to claim 2, wherein the complexing agent for copper comprises thiourea and/or wherein the acid comprises methanesulfonic acid.

4. The method of performing an immersion tin process in the production of a component carrier according to claim 1, wherein the immersing step is carried out at a temperature of from 50 to 95° C.; and/or
   wherein the immersing step is carried out under a gas pressure from 1.02 to 1.2 times atmospheric pressure.

5. The method of performing an immersion tin process in the production of a component carrier according to claim 1, wherein the non-oxidizing gas comprises at least 95 vol % of nitrogen.

6. The method of performing an immersion tin process in the production of a component carrier according to claim 1, wherein at least part of the non-oxidizing gas is re-introduced into the immersion tin unit.

7. The method of performing an immersion tin process in the production of a component carrier according to claim 1, further comprising:
   circulating at least part of the non-oxidizing gas through at least one of a fluid driving unit, a gas-gas heat exchanger, a gas-water heat exchanger, and/or a water removing unit.

8. The method of performing an immersion tin process in the production of a component carrier according to claim 1, wherein circulating comprises a volumetric rate of more than 100 m³/h.

9. The method of performing an immersion tin process in the production of a component carrier according to claim 1, wherein at least one non-oxidizing gas generation unit and the at least one immersion tin unit are located in a compartment.

* * * * *